United States Patent
Govorkov et al.

(10) Patent No.: US 7,433,374 B2
(45) Date of Patent: Oct. 7, 2008

(54) FREQUENCY-DOUBLED EDGE-EMITTING SEMICONDUCTOR LASERS

(75) Inventors: Sergei V. Govorkov, Mountain View, CA (US); R. Russel Austin, Cool, CA (US)

(73) Assignee: Coherent, Inc., Santa Clara, CA (US)

( * ) Notice: Subject to any disclaimer, the term of this patent is extended or adjusted under 35 U.S.C. 154(b) by 11 days.

(21) Appl. No.: 11/643,114

(22) Filed: Dec. 21, 2006

(65) Prior Publication Data

US 2008/0151948 A1    Jun. 26, 2008

(51) Int. Cl.
*H01S 3/10* (2006.01)
(52) U.S. Cl. .................. 372/22; 372/21; 372/43.01
(58) Field of Classification Search .......... 372/22, 372/21, 43.01
See application file for complete search history.

(56) References Cited

U.S. PATENT DOCUMENTS

| | | | | |
|---|---|---|---|---|
| 5,185,752 | A * | 2/1993 | Welch et al. | 372/22 |
| 5,384,797 | A | 1/1995 | Welch et al. | 372/23 |
| 5,406,575 | A * | 4/1995 | Chelny et al. | 372/45.013 |
| 5,513,204 | A | 4/1996 | Jayaraman | 372/96 |
| 5,627,853 | A | 5/1997 | Mooradian et al. | 372/92 |
| 6,252,896 | B1 | 6/2001 | Tan et al. | 372/50 |
| 6,258,704 | B1 | 7/2001 | Turner | 438/613 |
| 6,339,607 | B1 | 1/2002 | Jiang et al. | 372/50 |
| 6,424,669 | B1 | 7/2002 | Jiang et al. | 372/50 |
| 6,434,180 | B1 | 8/2002 | Cunningham | 372/50 |
| 6,448,642 | B1 | 9/2002 | Bewley et al. | 257/719 |
| 6,947,466 | B2 | 9/2005 | Anikitchev et al. | 372/75 |
| 2001/0043636 | A1 | 11/2001 | Bewley et al. | 372/70 |
| 2002/0001328 | A1 | 1/2002 | Albrecht et al. | 372/50 |
| 2003/0026312 | A1 | 2/2003 | Clayton et al. | 372/50 |
| 2004/0027648 | A1 | 2/2004 | Furukawa et al. | 359/328 |

FOREIGN PATENT DOCUMENTS

| | | |
|---|---|---|
| EP | 0 322 847 A2 | 12/1988 |
| JP | 62-86881 | 4/1987 |
| JP | 63-213384 | 9/1988 |
| JP | 63-276289 | 11/1988 |
| JP | 4-287389 | 10/1992 |
| JP | 9-307187 | 11/1997 |

(Continued)

OTHER PUBLICATIONS

L. Tusufura et al., "Doubled diode offers compact blue source," *Opto and Laser Europe*, No. 136, Feb. 2006, pp. 27-29.

(Continued)

*Primary Examiner*—Dung T Nguyen
(74) *Attorney, Agent, or Firm*—Stallman & Pollock LLP

(57) ABSTRACT

A frequency-doubled, edge-emitting semiconductor laser includes a separate confinement heterostructure surmounted by a waveguide including a converting layer of a periodically poled, optically nonlinear material. Fundamental radiation generated in the heterostructure is directionally coupled from the heterostructure into the waveguide, is converted to second-harmonic radiation in the converting layer and is delivered from the waveguide as output radiation. In one example, a distributed Bragg grating is included at an interface between the heterostructure and the waveguide for facilitating coupling of fundamental radiation from the heterostructure into the waveguide.

26 Claims, 7 Drawing Sheets

FOREIGN PATENT DOCUMENTS

| | | |
|---|---|---|
| JP | 2005-345949 | 12/2005 |
| WO | WO 00/62384 | 10/2000 |
| WO | WO 01/13481 A1 | 2/2001 |
| WO | WO 01/33678 A1 | 5/2001 |
| WO | WO 01/59895 A1 | 8/2001 |
| WO | WO 01/93386 A1 | 12/2001 |
| WO | WO 02/067393 A1 | 8/2002 |
| WO | WO 02/075879 A1 | 9/2002 |
| WO | WO 2004/077627 A2 | 9/2004 |

OTHER PUBLICATIONS

M. Maiwald et al., "600 mW optical output power at 488 nm by use of a high-power hybrid laser diode system and a periodically poled MgO:LiNbO$_3$ bulk crystal," *Optics Letters*, vol. 31, No. 6, Mar. 15, 2006, pp. 802-804.

M. Asobe et al., "Laser diode pumped 560-590 nm light source using sum-frequency generation in direct bonded quasi-phase matched LiNbO$_3$ waveguide," *Paper CML3, Optical Society of America 2006*, CLEO 2006, 3 pages in length.

Book by L.A. Coldren et al., *Diode Lasers and Photonic Integrated Circuits*, copyright 1995, Chapters Six ("Perturbation and Coupled-Mode Theory"), Seven ("Dielectric Waveguides"), and Eight ("Photonic Integrated Circuits"), pp. book cover, 10, 263-391.

H.Q.Le et al., "Diode-laser-pumped InGaAs/GaAs/AlGaAs heterostructure lasers with low internal loss and 4-W average power," *Appl. Phys. Lett.*, vol. 63, No. 11, Sep. 13, 1993, pp. 1465-1467.

\* cited by examiner

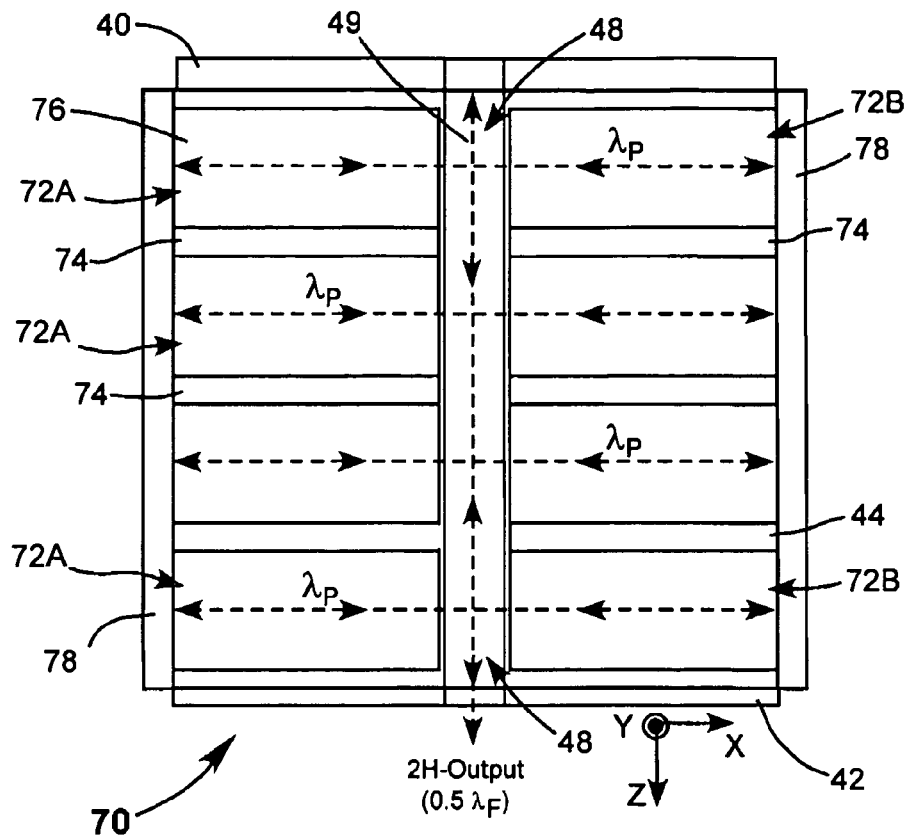
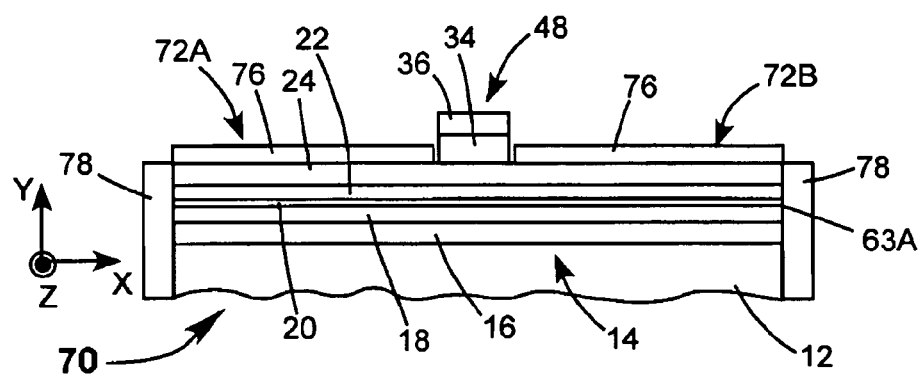
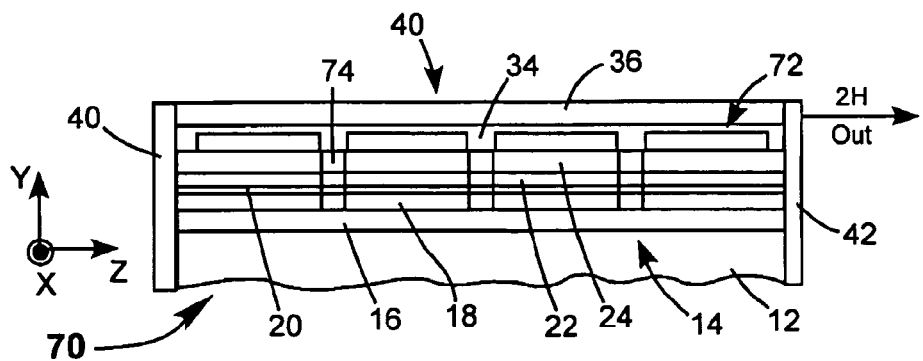

FREQUENCY-DOUBLED EDGE-EMITTING SEMICONDUCTOR LASERS

TECHNICAL FIELD OF THE INVENTION

The present invention relates in general to edge-emitting semiconductor lasers. The invention relates in particular to frequency-doubling fundamental radiation of electrically pumped, edge-emitting semiconductor lasers (diode-lasers) and optically pumped, edge-emitting semiconductor lasers.

DISCUSSION OF BACKGROUND ART

Compact, robust and inexpensive laser sources of visible light have many applications in consumer products, industrial processes and scientific instruments. Electrically pumped, edge-emitting semiconductor lasers, usually referred to by practitioners of the art as diode-lasers, are compact, robust and efficient. However, the most common commercially-available diode-lasers are lasers that emit light in the red region of the visible electromagnetic spectrum or the near infrared (NIR) region of the invisible electromagnetic spectrum. A few commercial suppliers are able to provide diode-lasers that emit fundamental radiation in the blue region of the visible electromagnetic spectrum. There are no commercially available diode-lasers that emit fundamental radiation at any wavelength between the red and blue regions of the visible electromagnetic spectrum.

One means of providing laser radiation in the spectral regions between red and blue is to frequency-double radiation from a diode-laser having a wavelength in the NIR region of the spectrum. In some prior-art arrangements for doing this, the output of a diode-laser is collected by suitable optics and directed into a frequency converter (frequency multiplier). This may be described as a direct frequency-doubling approach. As the peak power-output of a diode-laser output is relatively low (at most, a few Watts), a highly efficient optically nonlinear crystal is needed for frequency-doubling. Examples of such crystals are periodically poled (PP) crystals of lithium tantalate (LT), lithium niobate (LN), and KTP. Typically, a PP crystal forms a narrow waveguide, so that diode-laser radiation launched into the crystal remains at a high intensity level for an extended length, for example, several centimeters. Such an extended path with a high intensity is not achievable with a focused free-space beam.

A problem with this approach is that complex free-space optics are needed to launch the diode-laser output into the PP crystal. This generates additional problems due to a requirement for precise alignment and a high degree of mechanical stability. This also drives the cost of such a frequency-doubled diode-laser beyond a level tolerable in most applications. To put this in perspective, low-cost commercially available, diode-laser driven, green-light sources for use in laser pointers and laser displays are actually intra-cavity frequency-doubled solid-state lasers. In these lasers the NIR diode-laser optically pumps a crystal of a solid-state gain-medium to generate NIR fundamental radiation. This fundamental radiation is frequency-doubled by a relatively small (a few millimeters long), relatively inexpensive optically non-linear crystal located in the resonator of the solid-state laser. This may be described as an indirect frequency-doubling approach. While relatively inexpensive, these lasers are still somewhat vulnerable to misalignment by mechanical shock or temperature cycling. Accordingly, cost issues aside, in order to address stability and alignment problems in providing visible light from the fundamental-radiation of an NIR diode-laser, there is a need for a monolithic device that provides direct frequency-doubling in a PP optically nonlinear crystal without the need for free-space coupling optics.

SUMMARY OF THE INVENTION

The present invention is directed to monolithic laser apparatus for delivering second-harmonic radiation. In one aspect, apparatus in accordance with the present invention comprises a multilayer semiconductor laser heterostructure including a first waveguide. A second waveguide surmounts the semiconductor laser heterostructure. The second waveguide includes a layer of an optically nonlinear material. An arrangement is provided for energizing the laser heterostructure such that radiation having a fundamental wavelength is generated therein and propagates in the first waveguide. The heterostructure and the second waveguide are configured and arranged such that fundamental-wavelength radiation is coupled from the first waveguide into the second waveguide, propagates therein, and is converted by the optically-nonlinear-material layer into radiation having the second-harmonic wavelength of the fundamental wavelength. The second-harmonic wavelength radiation is delivered from the second-waveguide as output radiation.

The semiconductor heterostructure may be electrically or optically energized ("pumped"). The optically-nonlinear-material layer is preferably periodically poled.

Preferably the heterostructure has one grating formed thereon that is arranged to select the fundamental wavelength from the gain-bandwidth of the heterostructure and reduce the bandwidth of the fundamental-wavelength radiation to within the acceptance bandwidth of the optically-nonlinear-material layer. Preferably also there is another grating formed at an interface between the heterostructure and the second waveguide that is arranged to facilitate coupling of the fundamental radiation into the second waveguide.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIGS. 5A-C schematically illustrate another preferred embodiment of an optically pumped, frequency-doubled, edge-emitting, semiconductor laser similar to the laser of FIG. 4, but wherein the separate confinement semiconductor heterostructure is optically pumped by diode-laser radiation directed through the optically-nonlinear-crystal waveguide in a direction parallel to layers of the separate confinement heterostructure, the diode-laser pump-light being delivered by diode lasers extending through the heterostructure perpendicular to the direction of fundamental radiation circulation in the heterostructure.

DETAILED DESCRIPTION OF THE INVENTION

Figure 1:
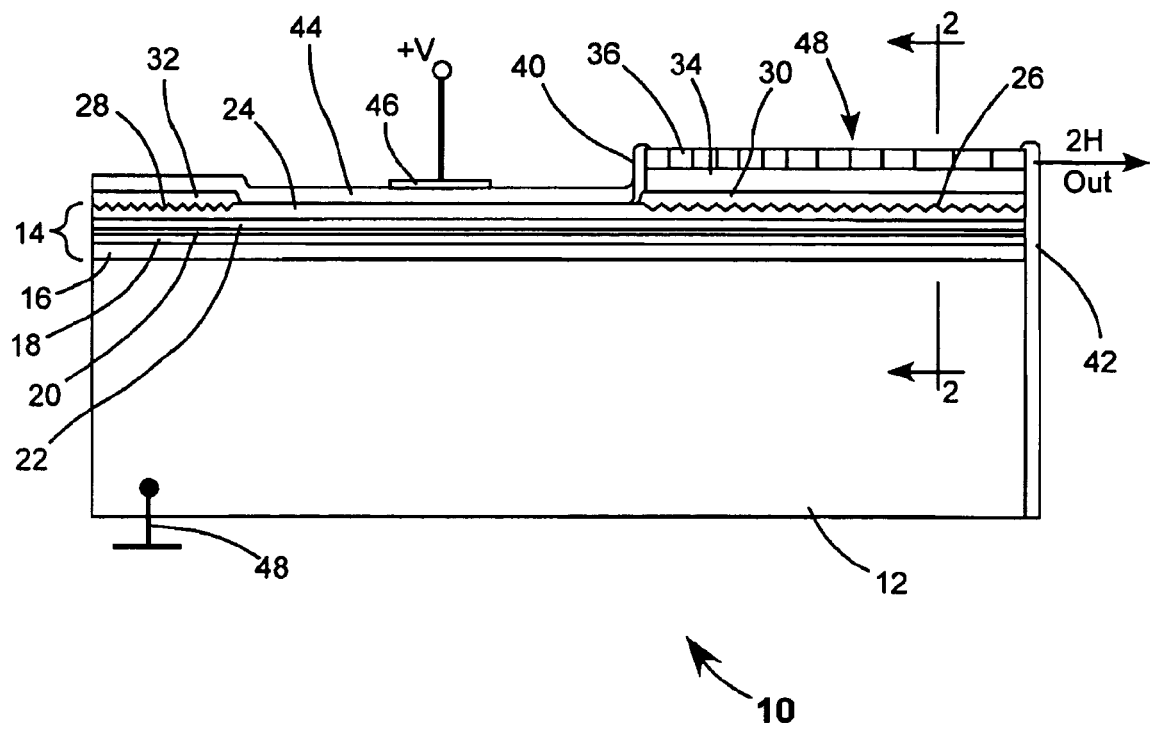
FIG. 1 is an un-shaded longitudinal cross-section view schematically illustrating one preferred embodiment of a frequency-doubled diode-laser in accordance with the present invention including an electrically pumped, separate-confinement semiconductor heterostructure for generating radiation at a fundamental wavelength surmounted at a first end thereof by a waveguide formed in a periodically poled optically nonlinear crystal layer, with a line narrowing grating formed at a second end of the heterostructure and a coupling grating formed at an interface between the heterostructure and the optically-nonlinear-crystal waveguide for coupling fundamental radiation in and out of the optically-nonlinear-crystal waveguide, and with coatings on each end of the optically-nonlinear-crystal waveguide for causing circulation of frequency-doubled radiation in the optically-nonlinear-crystal waveguide.
Figure 2:
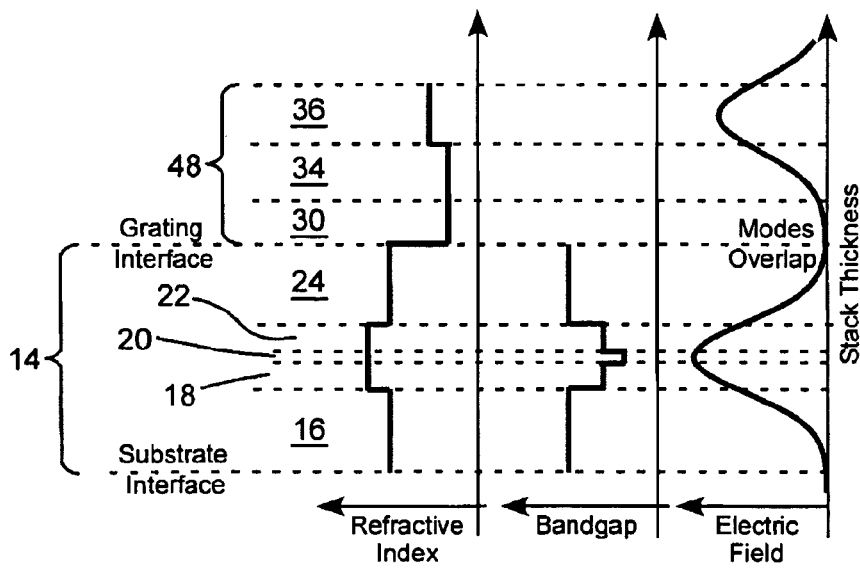
FIG. 2 schematically graphically represents a refractive index profile, bandgap profile, and electric-field intensity profile in the frequency-doubled diode-laser of FIG. 1 seen generally in the direction 2-2 of FIG. 1.

Referring now to the drawings, wherein like components are designated by like reference numerals, FIG. 1 is an un-shaded longitudinal cross-section view schematically illustrating one preferred embodiment 10 of a frequency-doubled diode-laser in accordance with the present invention. FIG. 2 schematically graphically represents a refractive index profile, bandgap profile, and an electric-field intensity profile in frequency doubled diode-laser 10 seen generally in the direction 2-2 of FIG. 1.

Laser 10 includes a single crystal substrate 12 on which is an epitaxially grown, separate-confinement semiconductor heterostructure 14. In this example, heterostructure 14 includes a lower cladding layer 16, a lower waveguide layer 18, a quantum-well layer 20, an upper waveguide layer 22, and an upper cladding layer 24. Layers of heterostructure 14 are preferably layers of various formulations of III-V materials. The relative refractive index and bandgap of the layers, whatever the materials, are depicted in FIG. 2. The refractive index of the quantum-well layer is not separately indicated in FIG. 2 as such a quantum-well layer is typically too thin for the refractive index to be meaningful. The quantum well layer can simply be considered as part of an active layer group including the waveguide layers that has an effective refractive index.

III-VI materials are commonly used for generating NIR fundamental wavelengths in similar heterostructures used in prior-art diode-lasers for delivering fundamental laser radiation. Heterostructure 14 is used in the present invention for generating NIR fundamental laser radiation, but this fundamental laser radiation is not delivered from the heterostructure. Substrate 12 may be a single crystal wafer of gallium arsenide (GaAs) or indium phosphide (InP) depending on the formulation of the layers of the heterostructure and accordingly the fundamental wavelength being generated. The fundamental wavelength generated is twice the desired output wavelength.

Growth methods including molecular-beam epitaxy (MBE) and metal-organic chemical vapor deposition (MOCVD), and formulations of III-V materials for determining fundamental wavelength are well known in the art to which the present invention pertains. A detailed description of these methods is not necessary for understanding principles of the present invention and, accordingly, is not presented herein. It should be noted that the heterostructure described is a simple form of separate confinement heterostructure usable in the present invention. More complex forms, for example, including multiple quantum-well layers, two or more layers having the function of waveguide layers 18 and 22, or two or more layers having the function of cladding layers 16 and 24 are known in the art and may be substituted for the depicted layers without departing from the spirit and scope of the present invention. Several III-V heterostructures ranging from a simple structure to quite complex structures are described in U.S. Pat. No. 5,889,805, assigned to the assignee of the present invention, and the complete disclosure of which is hereby incorporated herein by reference. It should further be noted that the terms "upper" and "lower" are used merely for convenience of description and should not be construed as implying that laser 10 must be used in the orientation depicted in FIG. 1.

An optional distributed Bragg reflector (DBR) grating 28 is formed in one end-portion of heterostructure 14. In this example, the grating is formed in the "upper" surface of cladding layer 24. This grating serves to narrow the bandwidth (line-width) of fundamental radiation generated in the heterostructure. This may be necessary for efficient frequency doubling. Preferably, the grating has a reflectivity sufficiently high at the fundamental wavelength that the grating also serves as one end-reflector of the heterostructure. The grating may be formed, for example, by electron-beam writing, or by microlithography followed by etching. Optionally, this grating maybe omitted. The emission bandwidth of diode-lasers typically ranges from 1 nm to 10 nm. The PP structure can be designed to accommodate the entire bandwidth of the fundamental emission. One means of accomplishing this is to form several sections with varying poling period along the length of the nonlinear waveguide (as schematically illustrated in FIG. 1 by vertical divisions in layer 36), such that the acceptance bandwidths of sections added together match the gain bandwidth of the laser. If grating 28 is omitted, a highly reflective coating for the fundamental wavelength is applied instead to heterostructure 14 at the end thereof where grating 28 would otherwise have been located.

Another (optional) grating 26 is formed in the "upper" surface of cladding layer 24 at an opposite end of heterostructure 14 from that of grating 28. This grating helps to couple a portion of fundamental light into a frequency converter structure 48, which is described further hereinbelow. It should be noted here that the extent of penetration of gratings 26 and 28 into cladding layer 24 is exaggerated in FIG. 1 for convenience of illustration and the depicted shape of the grating features is symbolic. In practice the physical thickness of such a cladding layer is between about 500 nm and 3000 nm, and the grating features extend about 100 nm into the layer.

Optional insulating layers are formed over DBR gratings 26 and 28, as these gratings cover regions of heterostructure 14 wherein the passage of current (necessary for electrically pumping the heterostructure) may be undesirable. Additionally, this layer may facilitate bonding of frequency-converter structure 48. Such insulating layers can be formed from silicon dioxide ($SiO_2$) or silicon nitride (SiN), as is known in the art. The layers can be formed by depositing a single layer on heterostructure 14 and etching the layer away in the region thereof between gratings 28 and 26. Other layers can be formed on top of the upper cladding layer, as known in the diode-laser art, for example, to create an ohmic contact.

Frequency converter 48 is a waveguide formed by a layer 34 and a layer 36, each thereof formed from a material transparent to both the fundamental radiation of heterostructure 14 and to the visible-light wavelength of (second-harmonic) radiation to be output by the inventive laser. Layer 36 has a higher refractive index than that of layer 34 (see FIG. 2). At least layer 36 is formed by a periodically poled nonlinear crystal, such as PPLN, PPLT or PPKTP. Layer 34 serves a cladding layer (here, an optical confinement layer) of the waveguide. Insulating layer 30 can also be considered as part of the cladding for the frequency-converter waveguide. The thickness of layer 34 is preferably between about 1 and 10 micrometers (μm). The thickness of layer 36 is preferably also between about 1 and 10 μm. The actual thicknesses are selected from this range to guide the waves both at fundamental and second-harmonic wavelength. Depending on the method of manufacture of the converter structure, there maybe another cladding layer above the layer 36. Periodically poled waveguides can be manufactured by diffusion bonding of layers, by proton exchange or inverse proton exchange, as is known in the art.

A preferred period (Λ) for grating 26 is determined by an equation:

$$\Lambda = 2\pi m / |k_1 - k_2| \quad (1)$$

where m is an integer, and $k_1$ and $k_2$ are the wave-vectors of waves propagating in the waveguide of the heterostructure and the frequency converter respectively, with:

$$k_1 = 2\pi n_1 / \lambda \quad (2)$$

and $$k_2 = 2\pi n_2 / \lambda \quad (3)$$

where λ is the fundamental wavelength of the heterostructure, $n_1$ is the effective refractive index of layers 18, 20 and 22, and $n_2$ is the effective refractive index of waveguide 48.

An optical coating 40 on one end of the waveguide is highly reflective for both the fundamental wavelength and the second-harmonic (2H) wavelength (half the fundamental wavelength). An optical coating 42 on an opposite end of the waveguide, and extending over the corresponding end of the heterostructure, is maximally reflective for the fundamental-radiation wavelength and at least partially transmissive for the 2H wavelength.

A metallization layer 44 is deposited over insulating layer 32 and upper cladding layer 24. Current can be passed through the heterostructure 14 via an electrode (anode) 46, with the substrate providing a negative electrode (cathode) 48, which may be at ground potential.

When current is passed through the heterostructure, fundamental radiation is generated therein. The radiation circulates in the heterostructure in a high-Q resonator formed between grating 28 and coating 42. Grating 26 perturbs the electric field in the resonator in the vicinity of the grating. This serves to couple fundamental radiation out of the resonator into the waveguide, wherein the fundamental radiation is converted to 2H-radiation. A portion of this fundamental radiation is converted into second-harmonic radiation in layer 36 and is output from waveguide 48 via coating 42. The remaining, unconverted, portion of IR light is reflected back along waveguide 48 toward coating 40 and is further partially converted to 2H radiation. Coating 40 returns the 2H radiation through waveguide 48 to be output from the laser via coating 42. Any unconverted fundamental radiation is again directed back toward coating 40. Continuously, of course, fundamental radiation is being coupled out of heterostructure 14 into 2H-generating waveguide 48 while converted fundamental radiation (2H-radiation) is being delivered out of waveguide 48.

The mechanism that causes some of the fundamental radiation circulating in the resonator of heterostructure 14 to couple into the optically nonlinear crystal layer 36 is known in the art as directional coupling between waveguides. In laser 10, one of the waveguides concerned is formed by the optical confinement structure of layers 18 and 22 bounded by cladding layers 16 and 24 having a lower refractive index (see FIG. 2). The other waveguide, as discussed above, is formed by periodically-poled optically nonlinear crystal layer 36, bounded on one side thereof by the lower-index-transparent layer 34, and on the other side thereof by air. Optionally, a lower-refractive-index layer can be deposited or bonded on top of layer 36, as noted above.

The necessary conditions for optimum coupling between the optical modes propagating in these two waveguide structures are spatial overlap of optical modes, and equality of propagation-constants of the modes, which follows from the momentum conservation condition. Spatial overlap of the modes occurs incidentally at the interface between the heterostructure 14 and waveguide 48 as illustrated in the electric-field graph of FIG. 2. However, as the active waveguide structure 14 and frequency converter waveguide 48 will usually have a different effective refractive index, the propagation-constant conditions will not be fulfilled. Grating 26 corrects for the mismatch in refractive indices and facilitates the coupling mechanism.

Laser 10 may be constructed with heterostructure 14 in the form of a "gain-guided resonator" wherein the lateral (transverse to the direction of circulation) extent of the resonator is defined primarily by the width of metallization layer 44. Preferably, however, the laser is constructed as a ridge-like structure, which is sometimes described as an index-guided resonator. This kind of structure provides lateral electrical and optical confinement, i.e., confinement in the plane of the layers of the laser, in additional to the confinement perpendicular to the plane of the layers provided by the refractive-index difference (optical) and the bandgap difference (electrical) between the layers. Several technologies are known in the diode-laser art that allow forming a ridge-like heterostructure with the width of few micrometers. Such a ridge-like structure allows higher current-to-optical conversion efficiency, as is known in the art. More important, however, is that such lateral optical confinement can help significantly in coupling (with or without optional grating 26) the fundamental wavelength radiation generated in heterostructure 14 into a correspondingly-narrow waveguide 48 including optically nonlinear crystal layer 36.

Figure 3:
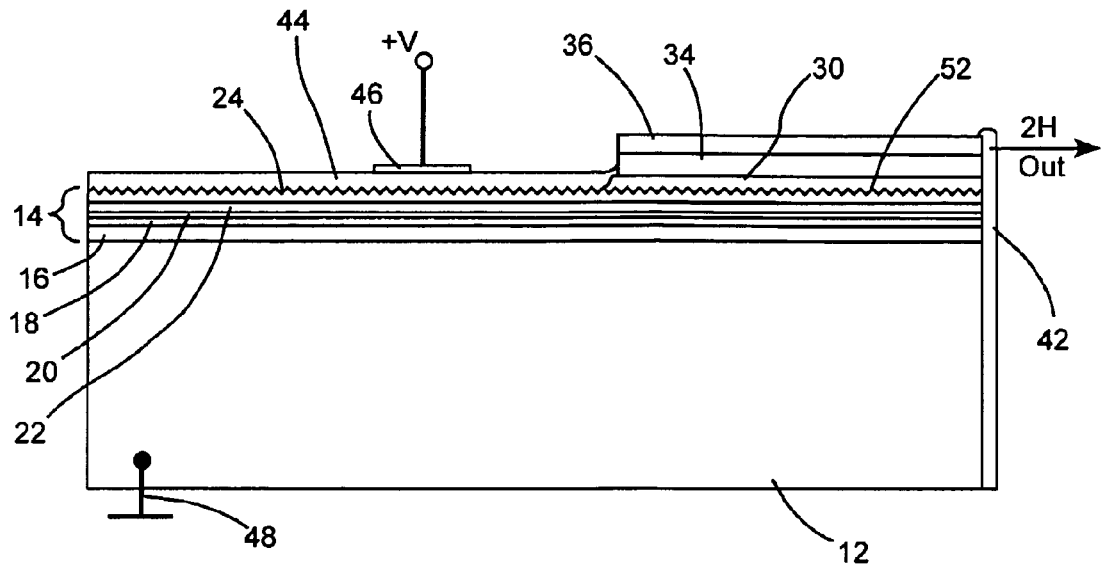
FIG. 3 is an un-shaded longitudinal cross-section view schematically illustrating another preferred embodiment of a frequency-doubled diode-laser in accordance with the present invention, similar to the laser of FIG. 1 but wherein a line-narrowing grating extends the entire length of the heterostructure.

FIG. 3 schematically illustrates another preferred embodiment 50 of a frequency-doubled diode-laser in accordance with the present invention. Laser 50 is similar to laser 10 of FIG. 1 with an exception as follows. In laser 50 a DBR grating 52 is formed over the entire length of heterostructure 14 in the upper surface of cladding layer 24 for locking and narrowing the fundamental wavelength. This is an arrangement similar to that in distributed feedback (DFB) diode-lasers. An advantage of this embodiment is that generation of fundamental radiation is more efficient than in laser 10. However, the nonlinear crystal layer in waveguide 48 is effectively outside of the fundamental laser resonator. A coating 42 as described above can be added to the front surface of the laser to increase intensity of fundamental radiation in the nonlinear crystal. Another grating having a grating period selected as described above can be overwritten on grating 52 for facilitating coupling between heterostructure 14 and the frequency-converter waveguide 48.

Figure 4:
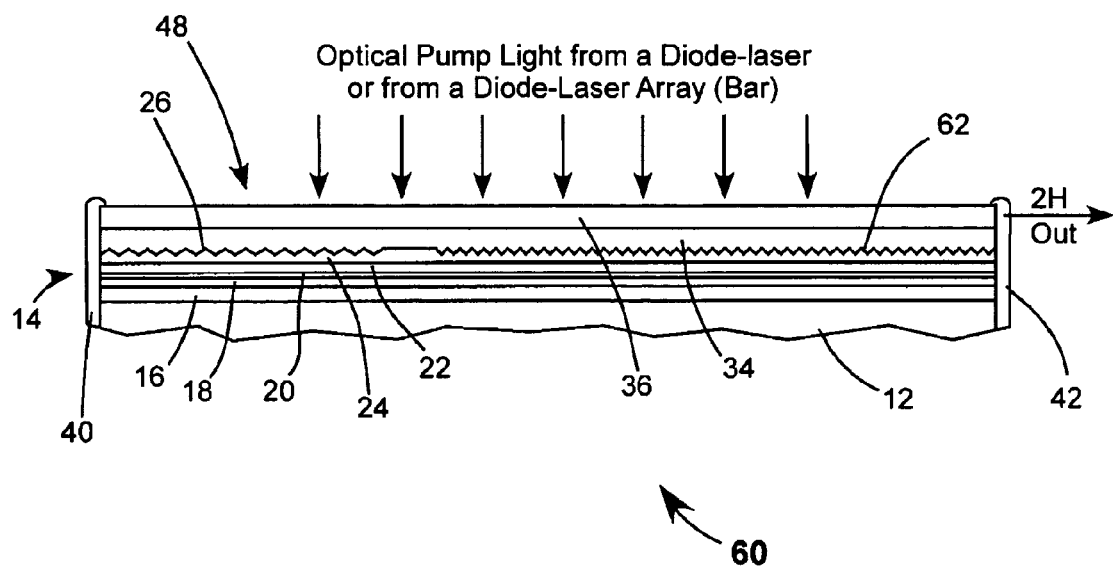
FIG. 4 is an un-shaded longitudinal cross-section view schematically illustrating one preferred embodiment of an optically pumped, frequency-doubled, edge-emitting, semiconductor laser in accordance with the present invention, similar to the laser of FIG. 1, but wherein the separate confinement semiconductor heterostructure is optically pumped by diode-laser radiation directed through the optically-nonlinear-crystal waveguide in a direction perpendicular to layers of the separate confinement heterostructure, and the optically-nonlinear-crystal waveguide extends along the entire length of the separate confinement semiconductor heterostructure.

FIG. 4 schematically illustrates one preferred embodiment 60 of an optically pumped, frequency-doubled, edge-emitting, semiconductor laser in accordance with the present invention. Laser 60 includes a heterostructure 14 as described above, and a frequency-converting (2H-generating) waveguide 48 extending along the entire length of the heterostructure in optical contact therewith. In this example, layer 34 of the wavelength converter is in contact with cladding layer 24 of the heterostructure. Fundamental laser radiation is generated in heterostructure 18 by optically pumping the heterostructure with light (radiation) from a diode-laser, or light from an array of diode-lasers, with the light delivered perpendicular to the plane of the layers. A line-narrowing grating 62 is included at the interface between layer 24 of the heterostructure and layer 34 of the wavelength converter waveguide 48. A grating 26 is also included at this interface for facilitating coupling between the heterostructure waveguide and the frequency-converter waveguide. Coatings 42 and 40 as specified above are provided to form a fundamental resonator that includes the frequency-converter waveguide. In a variation of this embodiment, the line-narrowing grating could extend the entire length of the laser as in laser 50 of FIG. 3, and the coupling grating could be overwritten on this line-narrowing grating. Several optical arrangements for optically pumping an edge-emitting heterostructure with light directed into the heterostructure perpendicular to the plane of the layers thereof are described in U.S. Pat. No. 7,136,408, assigned to the assignee of the present invention, and the complete disclosure of which is hereby incorporated herein by reference.

An advantage of laser 60 is that the laser is relatively simple to fabricate compared with the electrically pumped counterparts of FIGS. 1 and 3. Further as no p- or n-doped layers are required, long-term stability can be improved. Semiconductor materials from the II-VI group of semiconductors (with substrate material selected accordingly) can be used in heterostructure 14 for added wavelength flexibility. II-VI materials are not generally considered suitable for electrical pumping. Optically pumped II-VI structures are described in the above-referenced '408 patent. A significant disadvantage is that an additional component, a pump laser, is required, thus, somewhat increasing overall cost compared with electrically-pumped embodiments of the present invention.

Figure 6:
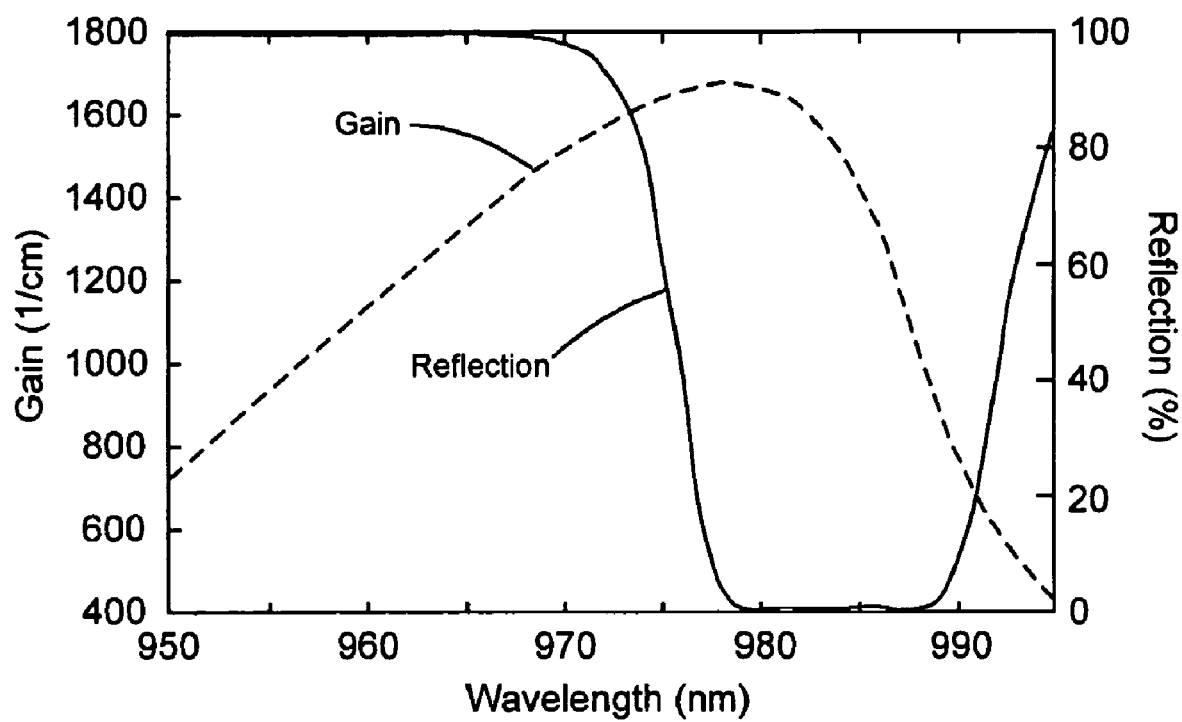
FIG. 6 is a graph schematically illustrating reflection as a function of wavelength for a facet reflector for pumping diode-lasers of FIGS. 5A-C and gain as a function of wavelength for an exemplary semiconductor heterostructure.

FIG. 5A, FIG. 5B, and FIG. 5C schematically illustrates another preferred embodiment 70 of an optically pumped frequency-doubled, edge-emitting, semiconductor laser in accordance with the present invention. In this embodiment, layers of the separate confinement heterostructure 14, initially, cover a square substrate (chip) 12. Four electrically pumped diode-lasers, each having one end 72A and an opposite end 72B, are defined in the heterostructure by metal electrodes 76 and slots 74, which are etched through the heterostructure between the electrodes. These diode-lasers are electrically pumped via electrodes 76. Each end of these diode lasers is coated with a maximally reflective coating 78 having a peak reflection wavelength on the short-wavelength side of the gain-bandwidth of the heterostructure, and having relatively low reflection on the long-wavelength side of the gain-bandwidth of the heterostructure. An exemplary spectrum of such a coating together with a typical gain spectrum is schematically graphically depicted in FIG. 6.

Electrically pumping these diode-lasers causes radiation having a wavelength $\lambda_P$, shorter than the peak-gain wavelength of the heterostructure, to circulate in the diode-laser. A fraction of this radiation is absorbed in the region of the heterostructure between the rows of electrodes that is not electrically pumped, and optically pumps this region of the heterostructure. This lateral optical pumping scheme is described in detail in U.S. Pat. No. 6,947,466, assigned to the assignee of the present invention, and the complete disclosure of which is hereby incorporated herein by reference.

An elongated, frequency-converting waveguide 48, including periodically poled optically nonlinear layer 36 and a cladding layer 34 is located with cladding layer 34 in optical contact with cladding layer 24, in the region between the rows of electrodes 76. Waveguide 48 extends the entire length of chip 12, perpendicular to the direction of oscillation of radiation of the electrically pumped diode-lasers. A bandwidth-narrowing (line-narrowing) and wavelength-locking grating (not shown), and a coupling-facilitating grating (also not shown) are written into cladding layer 24 in the region of that layer below waveguide 48. The gratings can be arranged as depicted in FIG. 4, or overwritten one on the other.

Coatings 40 and 42 having characteristics described above are deposited on opposite sides of chip 12. These coatings form resonator mirrors for the optically-pumped region of the heterostructure. Accordingly, fundamental radiation circulates in the separate confinement heterostructure between these coatings as described above with reference to laser 60 of FIG. 4. The direction of circulation is perpendicular to the direction of circulation of radiation in the electrically pumped diode-lasers. A portion of this radiation is coupled into the frequency converting waveguide for second-harmonic conversion. The fundamental radiation generated in the optically pumped portion of the heterostructure will have a wavelength $\lambda_F$ equal to or longer than the peak-gain wavelength of the heterostructure. This can be locked by the wavelength-locking grating. Second-harmonic (2H) radiation, here, having a wavelength $0.5\lambda_F$, is output from the frequency converting waveguide via coating 42 as described above.

Figure 7A:
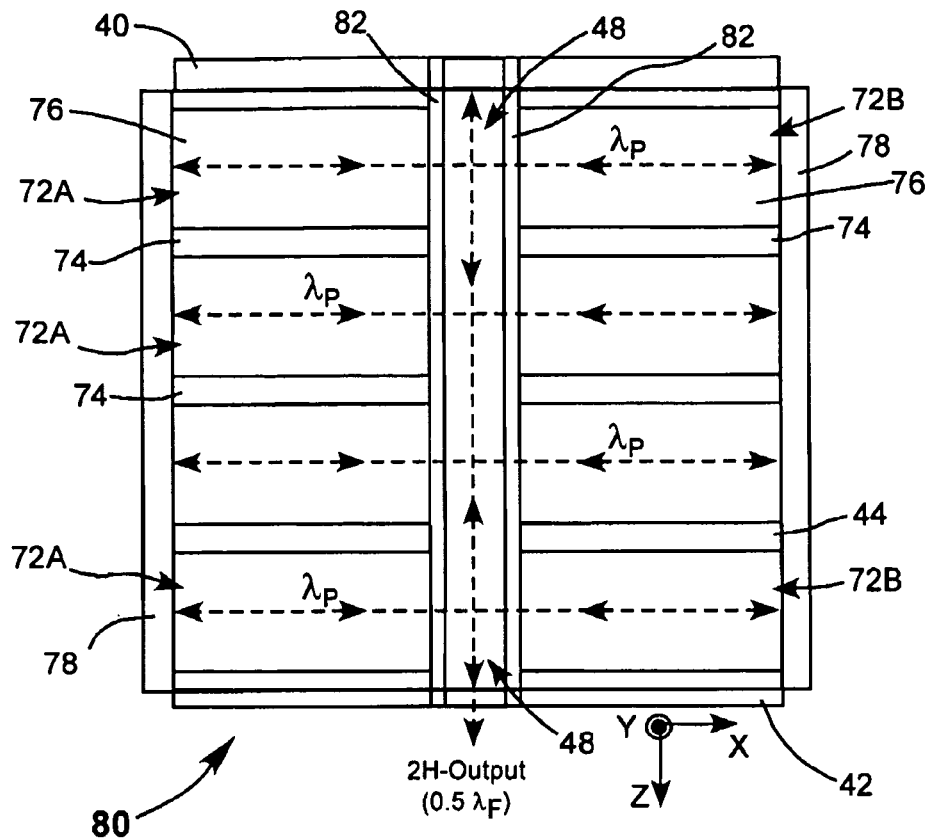
FIGS. 7A-C schematically illustrate yet another preferred embodiment of an optically pumped, frequency-doubled, edge-emitting, semiconductor laser similar to the laser of FIGS. 5A-C, but wherein the diode-laser pump-light is delivered by diode arrayed along each side of the separate confinement heterostructure.
Figure 7B:
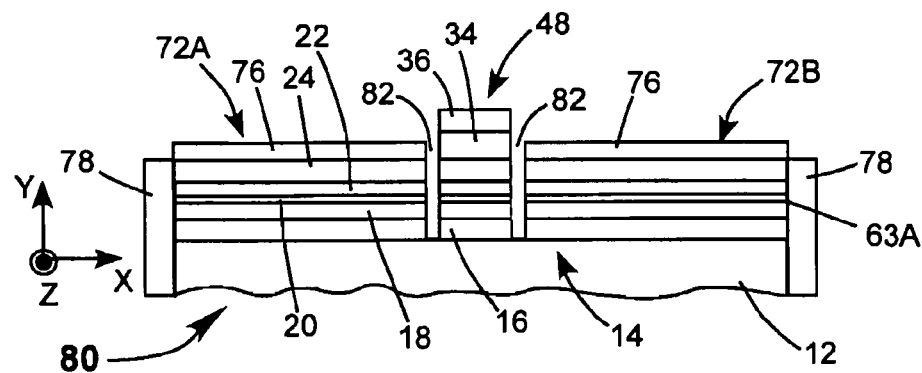
Figure 7C:
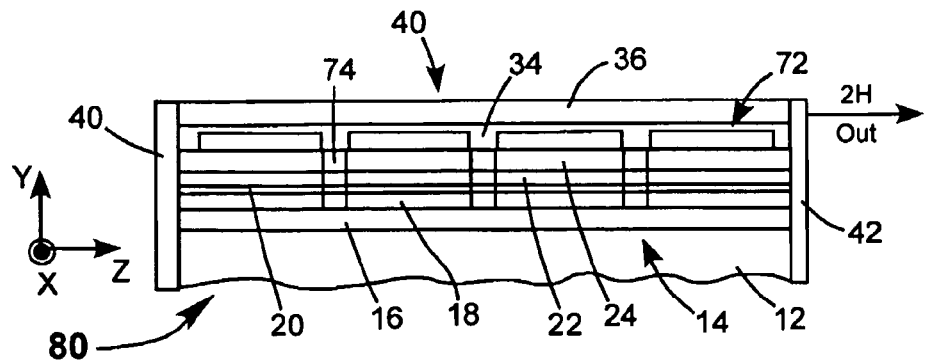

FIGS. 7A, 7B, and 7C schematically illustrate yet another embodiment 80 of an optically pumped frequency-doubled, edge-emitting, semiconductor laser in accordance with the present invention. Laser 80 is similar to laser 70 of FIGS. 5A-C with an exception that two elongated slots 82 are cut through heterostructure 14, parallel to the lasing direction of the optically pumped region of the laser. This creates eight diode lasers in two rows of four, one row each side of the region being optically pumped. Each diode-laser has the wavelength-selective coating 76 on an end thereof furthest from the optically pumped region, and an uncoated facet on an opposite end thereof adjacent the optically pumped region. This laser has an advantage over laser 70 inasmuch as the actual optically pumped laser is now in the narrow-ridge form discussed above, with the advantages of lateral optical and electrical confinement and improved coupling into the frequency-converting waveguide. This advantage may be partially offset by some inefficiency of coupling radiation from the diode-lasers into the optically pumped region.

Figure 8:
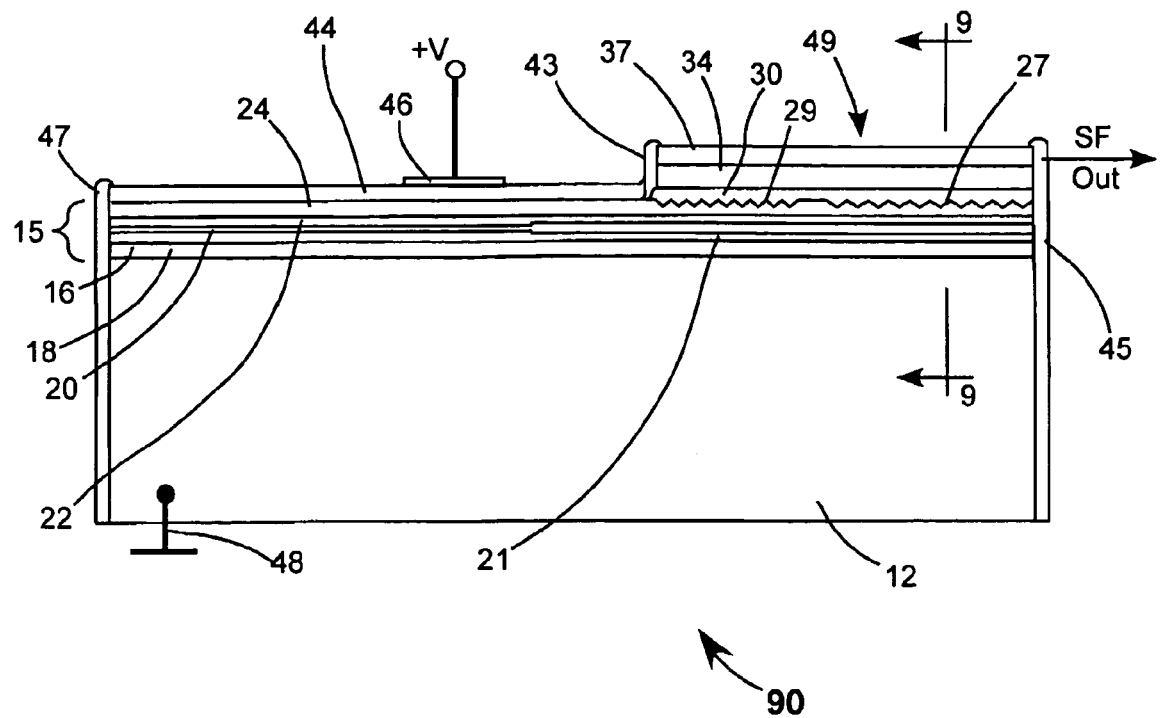
FIG. 8 is an un-shaded longitudinal cross-section view schematically illustrating a preferred embodiment of a sum-frequency generating diode-laser in accordance with the present invention, similar to the laser of FIG. 1 but wherein there is no line narrowing grating, wherein the heterostructure is arranged to generate fundamental radiation at first and second different wavelengths, and wherein the optically-nonlinear-crystal waveguide is arranged to sum-frequency mix the first-fundamental-wavelength radiation and the second-fundamental-wavelength radiation.
Figure 9:
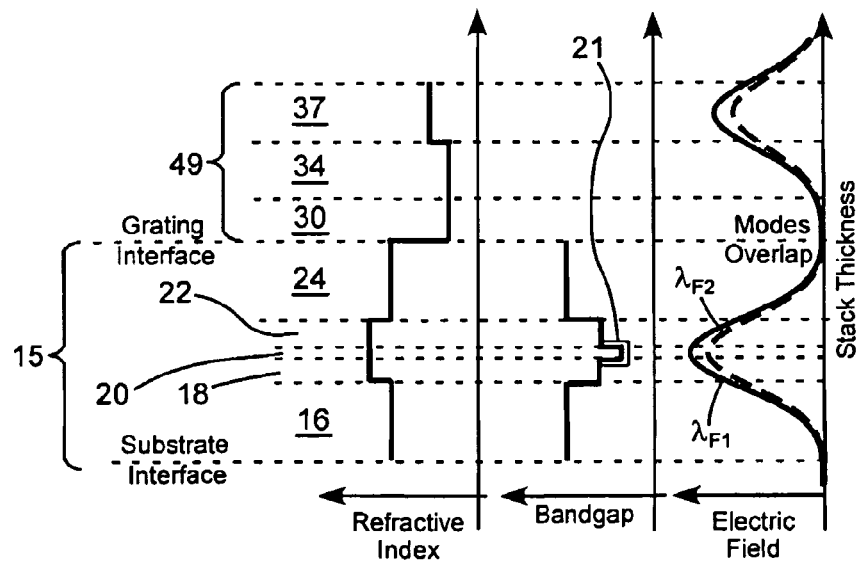
FIG. 9 schematically graphically represents a refractive index profile, bandgap profile, and electric-field intensity profiles in the sum-frequency generating diode-laser of FIG. 8 seen generally in the direction 9-9 of FIG. 8.

While embodiments of the inventive lasers are described above in terms of frequency doubling in a periodically poled waveguide, inventive principles of the lasers are not limited to lasers having frequency-doubled output. By way of example, FIG. 8 schematically illustrates an embodiment 90 of a frequency-converted diode-laser in which output radiation has the sum-frequency of two different fundamental wavelengths $\lambda_{F1}$ and $\lambda_{F2}$. FIG. 9 schematically graphically represents a refractive index profile, bandgap profile, and an electric-field intensity profile in frequency-converted diode-laser 90 seen generally in the direction 9-9 of FIG. 8.

This embodiment of the inventive lasers is similar to laser 10 of FIG. 1 with exceptions as follows. Heterostructure 14 of laser 10 is replaced in laser 90 by a heterostructure 15 having two quantum-well layers 20 and 21 arranged end-to-end. Other layers of the heterostructure provide optical and electrical confinement as discussed above. The composition and thickness of layer 20 is selected such that fundamental radiation having a wavelength $\lambda_{F1}$ is generated therein. The composition and thickness of layer 21 is selected such that fundamental radiation having a wavelength $\lambda_{F2}$ is generated therein. Optionally one or two line-narrowing gratings could be added to cladding layer 24, for respectively one or both of the fundamental wavelengths. Frequency-converter waveguide 48 of laser 10 is replaced in laser 90 by a waveguide 49. In waveguide 49 is a layer 37 of a periodically-poled optically nonlinear crystal material which is arranged to sum-frequency mix wavelengths $\lambda_{F1}$ and $\lambda_{F2}$.

Line-narrowing grating and end reflector 28 of laser 10 is replaced by an optical coating 47 that is highly reflective for both fundamental wavelengths. In practice wavelengths $\lambda_{F1}$ and $\lambda_{F2}$ will be relatively closely spaced, for example, one wavelength could be 980 nm and the other wavelength could be 1000 nm. Optical coating 42 of laser 10 is replaced in laser 90 by a coating 45 that is highly reflective at both $\lambda_{F1}$ and $\lambda_{F2}$ and at least partially transmissive for radiation having the sum-frequency (SF) wavelength of $\lambda_{F1}$ and $\lambda_{F2}$. Coatings 47 and 45 cause both of these fundamental wavelengths to circulate in the active-region (quantum-well layers and waveguide layers) of heterostructure 15.

Grating 26 of laser 10 is replaced in laser 90 by two gratings 27 and 29, one for each of the fundamental wavelengths, arranged end-to-end in the interface between the heterostructure and the frequency converter waveguide. Alternatively one of the gratings could be written over the other. The periods of gratings 27 and 29 are selected to facilitate coupling both fundamental wavelengths into frequency-converter waveguide 49. If $\lambda_{F1}$ and $\lambda_{F2}$ are sufficiently close, a single grating may be substituted for the two gratings. The mean of the two fundamental wavelengths can be substituted in equations (2) and (3) above for determining the grating period. The two fundamental wavelength radiations mix in layer 37 and radiation having the sum-frequency wavelength is delivered from waveguide 49 as output radiation (SF Out). Those skilled in the art will recognize that optically pumped variations of laser 90 may also be designed without departing from the spirit and scope of the present invention. Those skilled in the art will also recognize, without additional illustration or detailed description, that a diode-laser similar to laser 90 could be arranged to generate radiation having the difference-frequency of the two fundamental radiations.

Figure 10:
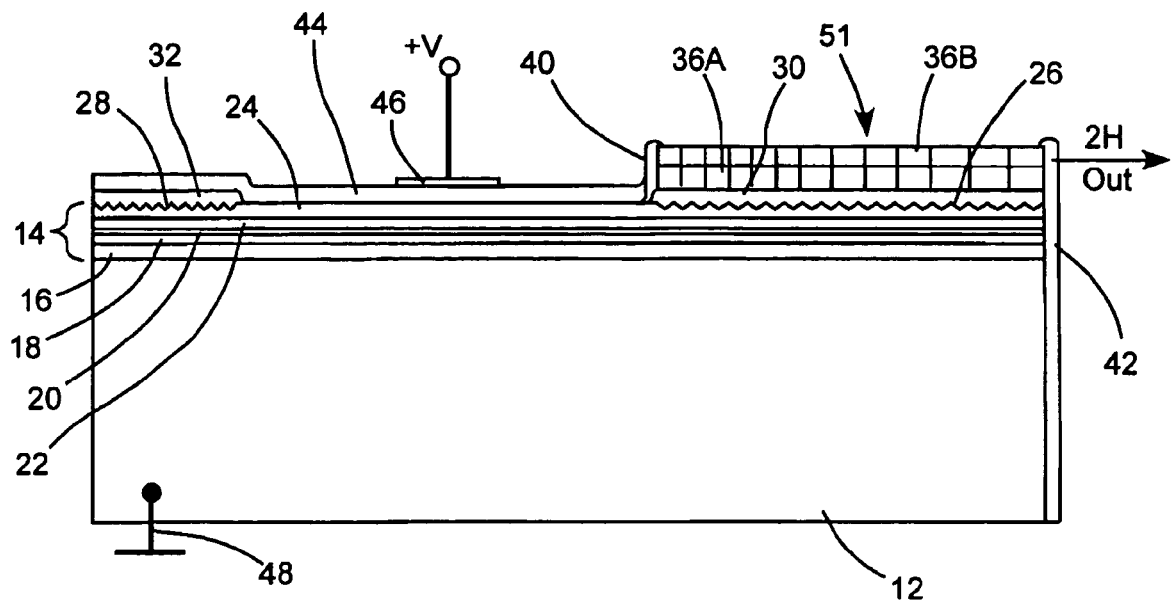
FIG. 10 is an un-shaded longitudinal cross-section view schematically illustrating yet another preferred embodiment of a frequency-doubled diode-laser in accordance with the present invention similar to the laser of FIG. 1, but having an alternative construction of the optically-nonlinear-crystal waveguide.
Figure 11:
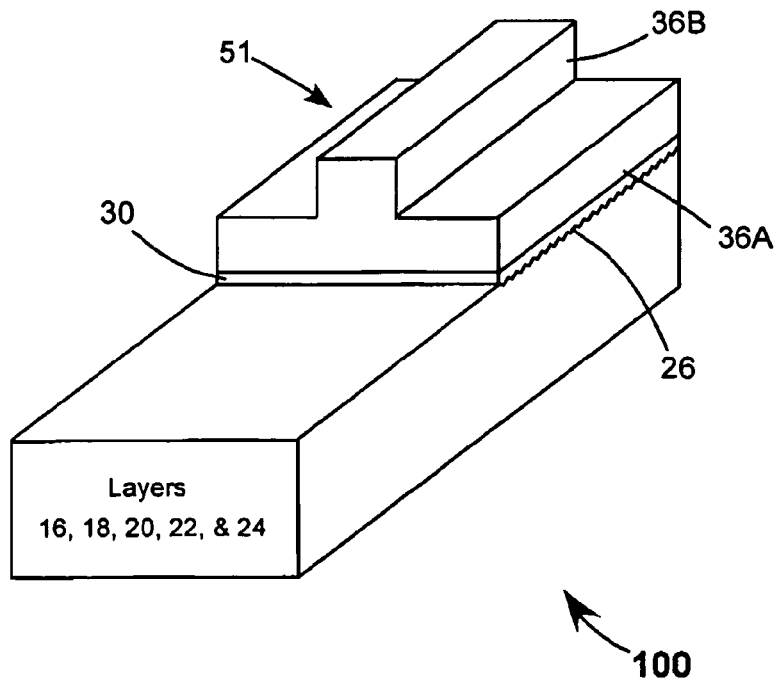
FIG. 11 is a three-dimensional view schematically illustrating detail of the optically-nonlinear-crystal waveguide in the frequency-doubled diode-laser of FIG. 10.

FIG. 10 is an un-shaded longitudinal cross-section view schematically illustrating yet another preferred embodiment 100 of a frequency-doubled diode-laser in accordance with the present invention frequency-converter waveguide. Further detail of the frequency converter waveguide is depicted in FIG. 11, wherein certain features of FIG. 10 have been omitted for simplicity of illustration. In laser 100, frequency-converter waveguide structure 48 of FIG. 1 is replaced by a frequency-converter waveguide structure 51 that does not include a low-refractive-index cladding layer 34. Instead, in frequency-converter waveguide structure 51, layer 36 of the periodically-poled optically nonlinear material has lower and upper portions 36A and 36B respectively. Portion 36A has the same width as heterostructure 14 (layers 16, 18, 20, 22, and 24). The active width (stripe width) of such a structure may be between about 5 μm and 100 μm. Portion 36B is in the form of a ridge on portion 36A and preferably has a width between about 2 μm and 30 μm. Portions 36A and 36B each have a thickness between about 1 μm and 10 μm. Portion 36A can be considered as cladding for portion 36B of the frequency-converter waveguide. Portion 36B can be considered as the core of the frequency-converter waveguide.

An advantage of this ridge-like waveguide structure is that it is somewhat simpler to construct than the multilayer structure of waveguide 48 of laser 10. The waveguide can be constructed by periodically poling a layer of material having the total thickness of portions 36A and 36B. The ridge-like portion can then be defined, for example by cutting with precision diamond saw. Those skilled in that art will recognize without further illustration or detailed description that this waveguide structure may be incorporated in other above-described embodiments of the present invention.

Those skilled in the art will further recognize that while frequency-doubled lasers in accordance with the present invention are described in terms of single frequency-converted emitters, in certain embodiments, it is possible to form an array of frequency-converted emitters on a single substrate (chip) in the manner of diode-laser emitters in a diode-laser bar. Such bundling of emitters helps reduce the cost per emitter and can be practiced with departing from the spirit and scope of the present invention.

Frequency-converted diode-lasers and optically-pumped edge-emitting lasers in accordance with the present invention may be fabricated using technologies available for fabricating diode-lasers and other semiconductor devices. By way of example, a preferred fabrication process for laser 10 of FIG. 1 would include a conventional epitaxial growth of the heterostructure 14, followed lithography and etching steps to form gratings 26 and 28. Then, insulating layers 30 and 32 would be formed by depositing a single layer. Layer 34 would then be deposited on insulating layer 30 and the periodically poled crystal layer 36 optically contact-bonded or diffusion bonded in optical contact with that layer. Then, lithography and etch steps would be carried out remove the excess of layer 34 and to separate the single insulating layer into layers 30 and 32. Metallization layer 44 is added then. The end surfaces would be formed by cleaving the wafer. Coatings 40 and 42 would then be deposited.

Those skilled in the art will recognize that the structure described above can be attached (preferably soldered or capillary bonded) to a highly thermally conductive heat sink. Such heat sink can be made of copper, ceramics (e.g. AlN, BeO), copper-tungsten alloy, diamond or diamond-like slab. For low power lasers, the heat sink can be simply attached at the bottom surface of the substrate (such as substrate 12 of FIG. 1). Additionally or instead, the heat sink can be attached to the top side of the structure (this is known in the art as "p-side down" geometry). In the case of optically pumped structure, the heat sink can be made of optically transmissive material, such as diamond. Alternatively, the manufacturing process can include epitaxial growth of the lasing heterostructure, bonding (soldering) of the wafer to a heat sink, etching off the substrate, writing gratings, depositing insulating layers, bonding the frequency converter structure, metallization and, finally, separating individual emitters and depositing the coatings.

An advantage of the inventive diode-lasers is that although the lasers provide frequency-doubled output, the lasers can be fabricated by the same proven technologies used to provide prior-art diode-lasers, have basically the same physical dimensions, and are electrically energized in the same way. Accordingly the inventive lasers can be formed into one and two-dimensional arrays using any prior-art scheme, and the frequency-doubled laser-output can be coupled into optical fibers, or projected by suitable optics using arrangements that are used, or have been proposed, for conventional diode-lasers and diode-laser bars.

The frequency-doubled light-output can have any visible wavelength that is half the fundamental wavelength obtainable with InP or GaAs compatible III-V semiconductor material. This offers a range of output wavelengths from the yellow, through the green and blue, to the violet region of the visible spectrum. It is even possible to generate ultraviolet radiation by frequency-doubling fundamental radiation of a heterostructure with one or more quantum-well layers of an indium gallium aluminum phosphide composition $In(Ga_{1-x}Al_x)_{0.5}P$ wherein varying x can provide fundamental wavelengths between about 600 nm and 700 nm, offering the possibility of frequency-doubled output at ultraviolet wavelengths between about 300 nm and 350 mm.

Those skilled in the art will recognize, without detailed description or illustration, that arrays of such UV frequency doubled lasers could provide pump-light for InGaN and GaN based optically-pumped, external cavity, surface emitting semiconductor lasers (OPS-lasers) to provide a high quality beam of blue-light or near ultraviolet light. Arrays of the inventive diode-lasers having output in the purplish-blue region of the visible spectrum could be used to pump OPS lasers having quantum-well layers of II-VI materials to produce high quality beams of blue or greenish-blue light. Optically pumped II-VI semiconductor lasers are described in the above-referenced U.S. Pat. No. 7,136,408 as noted above. Arrays of the inventive lasers emitting frequency-doubled radiation at wavelengths between 440 and 480 nm could be used to optically pump praseodymium-doped yttrium lithium fluoride (Pr:YLF) for generating high-quality light-beams at wavelengths including 522 nm 545 nm, and 639 nm, which could either be used as green or red components of an RGB (white light) source or be frequency-doubled to provide high-quality beams of ultraviolet light.

In summary, the present invention is described above in terms of preferred and other embodiments. The invention is not limited, however, to the embodiments described and depicted. Rather, the invention is limited only by the claims appended hereto.

What is claimed is:

1. Laser apparatus, comprising:
a multilayer semiconductor laser heterostructure including a first waveguide;
a second waveguide surmounting the semiconductor laser heterostructure, said second waveguide including a layer of an optically nonlinear material;
an arrangement for optically pumping said laser heterostructure such that radiation having a fundamental wavelength is generated therein and propagates in the first waveguide; and
wherein said heterostructure and said second waveguide are configured and arranged such that fundamental-wavelength radiation is coupled from said first waveguide into said second waveguide, propagates therein, and is converted by said optically nonlinear material layer into radiation having the second-harmonic wavelength of said fundamental wavelength, and second-harmonic-wavelength radiation is delivered from the second waveguide as output radiation.

2. The apparatus of claim 1, wherein said optically nonlinear material is periodically poled.

3. The apparatus of claim 2, wherein said fundamental radiation has a fundamental radiation bandwidth and the period of said periodic poling is varied along the length of said optically-nonlinear-material layer such that said optically-nonlinear-material layer has an acceptance bandwidth that is about equal to or greater than said fundamental radiation bandwidth.

4. The apparatus of claim 1, wherein said heterostructure has a gain-bandwidth, said fundamental-wavelength radiation has a bandwidth less than said gain-bandwidth, and wherein the apparatus further includes a first grating formed on said heterostructure and arranged to select said fundamental wavelength from said gain-bandwidth.

5. The apparatus of claim 4, wherein said optically-nonlinear-material layer has an acceptance bandwidth for frequency doubling, and said second grating is further arranged to reduce the bandwidth of said fundamental-wavelength radiation to a value about equal to or less than the acceptance bandwidth of said optically-nonlinear material layer.

6. The apparatus of claim 4, wherein there is a second grating formed at an interface between said heterostructure and said second waveguide, said second grating arranged to facilitate coupling of said fundamental radiation into said second wave guide.

7. The apparatus of claim 4, wherein the heterostructure has a first length and first and second ends, and the second waveguide has a second length and first and second ends, wherein said first ends of said heterostructure and said second waveguide are aligned with each other and have a first wavelength-selective optical coating thereon, said first optical coating having high reflectivity at said fundamental-wavelength and being at least partially transmissive at said second-harmonic wavelength.

8. The apparatus of claim 4, wherein said second length is shorter than said first length, and wherein said second end of said second waveguide has a second optical coating thereon, said second optical coating having high reflectivity at said fundamental-wavelength and said second-harmonic wavelength.

9. The apparatus of claim 8, wherein said first grating has a high reflectivity for said fundamental wavelength, whereby said grating and said first optical coating define a laser resonator including said first waveguide.

10. The apparatus of claim 8, wherein said first and second lengths are equal, and wherein said second ends of said heterostructure and said second waveguide have a second optical coating thereon, said second optical coating having high reflectivity at said fundamental-wavelength and said second-harmonic wavelength.

11. The apparatus of claim, 1, wherein said multilayer heterostructure includes layers of semiconductor materials from the III-V group of semiconductor materials.

12. The apparatus of claim, 1, wherein said multilayer heterostructure includes layers of semiconductor materials from the II-VI group of semiconductor materials.

13. Laser apparatus, comprising:
a semiconductor laser heterostructure including a first waveguide, said heterostructure having a first length and having first and second ends;
a second waveguide surmounting the semiconductor laser heterostructure, said second waveguide having a second length and having first and second ends, and said second waveguide including a layer of an optically nonlinear material;
said first ends of said heterostructure and said second waveguide aligned with each other and have a first wavelength-selective optical coating thereon, said first optical coating having high reflectivity at a fundamental-wavelength of said laser heterostructure and being at least partially transmissive at a second-harmonic wavelength of said fundamental wavelength;
said second end of said second waveguide having a second optical coating thereon, said second optical coating having a high reflectivity for said fundamental wavelength and said second-harmonic wavelength;
an arrangement for optically pumping said laser heterostructure such that radiation having said fundamental wavelength is generated therein and propagates in the first waveguide; and
wherein said heterostructure and said second waveguide are configured and arranged such that fundamental-wavelength radiation is coupled from said first waveguide into said second waveguide, circulates therein, and is converted by said optically nonlinear material layer into radiation having the second-harmonic wavelength of said fundamental wavelength, said second-harmonic-wavelength radiation being delivered from said second waveguide, via said first optical coating, as output radiation.

14. The apparatus of claim 13, wherein said second length is shorter than said first length.

15. The apparatus of claim 13, wherein said first and second lengths are equal.

16. The apparatus of claim 15, wherein said second optical coating is also on said second end of said heterostructure.

17. The laser of claim 13, wherein said optically-nonlinear-material layer has an acceptance bandwidth, said heterostructure has a gain-bandwidth, said fundamental radiation has a bandwidth less than said gain bandwidth, and said heterostructure includes first and second gratings, said first grating being configured and arranged to select said fundamental wavelength from said gain-bandwidth and reduce said fundamental radiation bandwidth to about equal to or less than said acceptance bandwidth, and said second grating being located at an interface between said heterostructure and said second waveguide and being configured and arranged to facilitate said coupling of said fundamental radiation into said second waveguide.

18. Laser apparatus, comprising:
a multilayer semiconductor laser heterostructure including a first waveguide;
a second waveguide surmounting the semiconductor laser heterostructure, said second waveguide including a layer of an optically nonlinear material;
an arrangement for delivering optical radiation to said heterostructure for optically energizing said laser heterostructure such that radiation having a fundamental wavelength is generated therein and propagates in the first waveguide; and
wherein said heterostructure and said second waveguide are configured and arranged such that fundamental-wavelength radiation is coupled from said first optically nonlinear material layer into radiation having the second-harmonic wavelength of said fundamental wavelength, and second-harmonic-wavelength radiation is delivered from the second waveguide as output radiation.

19. The laser of claim 18, wherein said optical-radiation-delivery arrangement delivers said optical radiation to said heterostructure in a direction about perpendicular to the plane of layers of said heterostructure.

20. The laser of claim 18, wherein said optical-radiation-delivery arrangement delivers said optical radiation to said heterostructure in a direction about parallel to the plane of layers of said heterostructure.

21. The apparatus of claim 18, wherein said energizing arrangement is an electrical energizing arrangement.

22. Laser apparatus, comprising:
a multilayer semiconductor laser heterostructure including a first waveguide, said heterostructure including first and second different quantum well layers, arranged end-to-end in said first waveguide;
a second waveguide surmounting the semiconductor laser heterostructure, said second waveguide including a layer of an optically nonlinear material;
an arrangement for energizing said laser heterostructure such that radiation having first and second wavelengths, corresponding to said different quantum-well layers is generated therein and propagates in said first waveguide; and
wherein said heterostructure and said second waveguide are configured and arranged such that first-wavelength radiation and second-wavelength radiation are coupled from said first waveguide into said second waveguide, propagate therein, and are converted by said optically nonlinear material layer into radiation having the sum-frequency wavelength of said first and second wavelengths, and sum-frequency-wavelength radiation is delivered from the second waveguide as output radiation.

23. Laser apparatus, comprising:
a multilayer semiconductor laser heterostructure including a first waveguide having at least one set of quantum well layers formed therein;
a second waveguide surmounting the semiconductor laser heterostructure, said second waveguide including a layer of an optically nonlinear material;
an arrangement for optically pumping said laser heterostructure such that radiation having at least one wavelength is generated therein and propagates in the first waveguide; and wherein said heterostructure and said second waveguide are configured and arranged such that radiation generated in the first waveguide is coupled from said first waveguide into said second waveguide, propagates therein, and is converted by said optically nonlinear material layer into radiation having a different wavelength than said one wavelength and wherein said harmonically converted radiation is delivered from the second waveguide as output radiation.

24. A laser apparatus as recited in claim 23 wherein said different wavelength generated by said nonlinear material layer is the second harmonic with respect to said first wavelength.

25. A laser apparatus as recited in claim 23 wherein said heterostructure includes first and second different quantum well layers, arranged end-to-end in said first waveguide and wherein when energized, radiation having first and second wavelengths is generated corresponding to said different quantum-well layers and wherein said first and second wavelengths are converted by said optically nonlinear material layer into radiation having the sum-frequency wavelength of said first and second wavelengths.

26. A laser apparatus, comprising:
   a multilayer semiconductor laser heterostructure including a first waveguide;
   a second waveguide surmounting the semiconductor laser heterostructure, said second waveguide including a layer of an optically nonlinear material, said nonlinear material being periodically polled;
   an arrangement for energizing said laser heterostructure such that radiation having a fundamental wavelength is generated therein and propagates in the first waveguide; and
   wherein said heterostructure and said second waveguide are configured and arranged such that fundamental-wavelength radiation is coupled from said first waveguide into said second waveguide, propagates therein, and is converted by said optically nonlinear material layer into radiation having the second-harmonic wavelength of said fundamental wavelength, and second-harmonic-wavelength radiation is delivered from the second waveguide as output radiation and wherein said fundamental radiation has a fundamental radiation bandwidth and the period of said periodic polling is varied along the length of said optically-nonlinear-material layer such that said optically-nonlinear-material layer has an acceptance bandwidth that is about equal to or greater than said fundamental radiation bandwidth.

* * * * *